United States Patent
Liu et al.

(10) Patent No.: US 10,330,711 B2
(45) Date of Patent: Jun. 25, 2019

(54) METHOD AND DEVICE FOR DETECTING CURRENT OF INDUCTOR OF PFC CIRCUIT

(71) Applicant: ZTE CORPORATION, Shenzhen, Guangdong Province (CN)

(72) Inventors: Tao Liu, Shenzhen (CN); Jianping Zhou, Shenzhen (CN); Guoxian Lin, Shenzhen (CN); Jie Fan, Shenzhen (CN); Yong Luo, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 0 days.

(21) Appl. No.: 15/305,104

(22) PCT Filed: Oct. 28, 2014

(86) PCT No.: PCT/CN2014/089678
§ 371 (c)(1),
(2) Date: Oct. 19, 2016

(87) PCT Pub. No.: WO2015/161634
PCT Pub. Date: Oct. 29, 2015

(65) Prior Publication Data
US 2017/0045555 A1    Feb. 16, 2017

(30) Foreign Application Priority Data

Apr. 22, 2014 (CN) .......................... 2014 1 0161475

(51) Int. Cl.
*G01R 19/25* (2006.01)
*H02M 1/42* (2007.01)
(Continued)

(52) U.S. Cl.
CPC ....... *G01R 19/2506* (2013.01); *G01R 15/183* (2013.01); *G01R 19/0092* (2013.01);
(Continued)

(58) Field of Classification Search
CPC ............ G01R 19/2506; G01R 19/0092; G01R 15/183; H02M 1/4225; H02M 1/4208;
(Continued)

(56) References Cited

U.S. PATENT DOCUMENTS 5,617,013 A * 4/1997 Cozzi .................. H02H 7/1255
                                                              323/207
6,980,445 B2 * 12/2005 Fukumoto ........... H02M 1/4225
                                                              323/246
(Continued)

FOREIGN PATENT DOCUMENTS

| CN | 102334269 A | 1/2012 |
|---|---|---|
| CN | 102721848 A | 10/2012 |
| CN | 102843025 A | 12/2012 |
| CN | 103412181 A | 11/2013 |
| CN | 203465347 U | 3/2014 |

OTHER PUBLICATIONS

Power Factor Controller; System General Corp. Version 1.0(IRO33. 0006.B2); www.sg.com.tw, Nov. 24, 2003; SG6561A-XP055347361.

*Primary Examiner* — Lee E Rodak
(74) *Attorney, Agent, or Firm* — Ling Wu; Stephen Yang; Ling and Yang Intellectual Property

(57) ABSTRACT

A method and device for detecting inductor current of a PFC circuit are disclosed, which relates to the field of power supply technology. The method includes: detecting a voltage on a boost inductor of a critical-conduction mode PFC circuit, and obtaining an inductor voltage detection signal (S1); converting the inductor voltage detection signal into a voltage signal whose waveform is consistent with a current waveform of the inductor to serve as an inductor current detection signal, to perform loop protection on the PFC circuit or perform over-current protection on the PFC circuit by using the inductor current detection signal (S2).

9 Claims, 6 Drawing Sheets

(51) Int. Cl.
*H02H 7/12* (2006.01)
*G01R 15/18* (2006.01)
*G01R 19/00* (2006.01)
*H02M 1/00* (2006.01)

(52) U.S. Cl.
CPC ............ *H02H 7/12* (2013.01); *H02M 1/4208* (2013.01); *H02M 1/4225* (2013.01); *H02M 2001/0009* (2013.01); *Y02B 70/126* (2013.01); *Y02P 80/112* (2015.11)

(58) Field of Classification Search
CPC ................ H02M 1/4233; H02M 1/42; H02M 2001/0009; H02H 7/12; Y02P 80/112; Y02B 70/126; Y02B 70/1491; G05F 1/70
See application file for complete search history.

(56) References Cited

U.S. PATENT DOCUMENTS

| | | | |
|---|---|---|---|
| 8,213,135 B2* | 7/2012 | Kim ........................ | H02M 1/32 361/18 |
| 8,630,105 B2* | 1/2014 | Uno ........................ | H02M 1/36 323/299 |
| 2006/0061337 A1 | 3/2006 | Kim et al. | |
| 2006/0119337 A1* | 6/2006 | Takahashi ................. | G05F 1/70 323/282 |
| 2007/0085517 A1* | 4/2007 | Ribarich ................... | G05F 1/70 323/235 |
| 2009/0230929 A1* | 9/2009 | Sui ........................... | G05F 1/70 323/207 |
| 2014/0035541 A1* | 2/2014 | Jin ........................... | G05F 1/70 323/210 |

* cited by examiner

METHOD AND DEVICE FOR DETECTING CURRENT OF INDUCTOR OF PFC CIRCUIT

TECHNICAL FIELD

The present document relates to the field of power supply technology, and more particularly, to a method and device for detecting inductor current of a critical-conduction mode Power Factor Correction (PFC) circuit.

BACKGROUND OF THE RELATED ART

Nowadays, the application of more and more electric and electronic devices aggravates the harmonic pollution of the power grid, in order to better reduce the harmonic waves, the PFC circuit is widely applied. Meanwhile, the PFC circuit also develops towards a direction of high efficiency and high power density.

In multitudinous PFC circuits, a Critical-conduction Mode (CRM) PFC circuit is extensively applied. With the topology of the totem-pole-type bridgeless PFC circuit as an example, when working in a critical-conduction mode, it can realize Zero voltage switch (ZVS) or Valley switch (VS) in the full alternating current input range and full load range, and also can simultaneously meet the requirements of high power density and high efficiency.

FIG. 1 is a structure diagram of a critical-conduction bridge PFC circuit for detecting inductor current of the PFC circuit in the related art. As shown in FIG. 1, the critical-conduction bridge PFC circuit includes at least two bridge arms connected in parallel between a first connection point A and a second connection point B, herein a first bridge arm includes two diodes connected in series in the same direction, and a second bridge arm includes two diodes connected in series in the same direction. The critical-conduction bridge PFC circuit also includes one PFC inductor, there is one switch tube S1 between a third connection point C and the second connection point B, there is one diode D5 between the third connection point C and a fourth connection point D, and there are a filter capacitor C0 and a load R0 also connected in parallel between the fourth connection point D and the second connection point B.

FIG. 2 is a structure diagram of a totem-pole-type bridgeless PFC circuit for detecting inductor current of the PFC circuit in the related art. As shown in FIG. 2, the totem-pole-type bridgeless PFC circuit includes at least two bridge arms connected in parallel between a first connection point A and a second connection point B, herein a first bridge arm includes two switch tubes or diodes connected in series in the same direction, and a second bridge arm includes two switch tubes connected in series in the same direction. The totem-pole-type bridgeless PFC circuit includes one PFC inductor, and a filter capacitor C0 and a load R0 also connected in parallel between the first connection point A and the second connection point B. When the input voltage is in the positive half cycle, a diode D2 is always conductive, a switch tube S2 is closed, a switch tube S1 is disconnected, and at this point the current on an inductor L increases from zero to store energy; after the above energy storage process ends, the switch tube S2 is disconnected, the switch tube S1 is closed, and at this point the current on the inductor L decreases from the peak value to release energy. When the input alternating voltage is in the negative half cycle, a diode D1 is always conductive, the switch tube S1 is closed, the switch tube S2 is disconnected, and at this point the current on the inductor L increases from zero to store energy; after the above energy storage process ends, the switch tube S1 is disconnected, the switch tube S2 is closed, and at this point the current on the inductor L decreases from the peak value to release energy.

However, in the process of applying the critical-conduction bridge PFC circuit and the totem-pole-type bridgeless PFC circuit in the related art to perform practice and research, the critical-conduction mode power factor correction circuit is required to timely and accurately obtain an inductor current signal which is used for loop control or implementing the inductor current protection function, but how to obtain the inductor current signal is a problem required to be urgently solved by the researchers.

SUMMARY

The object of the embodiments of the present document is to provide a method and device for detecting inductor current of a PFC circuit, which may solve the problem that the inductor current of the PFC circuit cannot be obtained in a critical-conduction mode.

According to one aspect of the embodiment of the present document, a method for detecting inductor current of a PFC circuit is provided, which includes:

detecting a voltage on a boost inductor of a critical-conduction mode PFC circuit, and obtaining an inductor voltage detection signal;

converting the inductor voltage detection signal into a voltage signal whose waveform is consistent with a current waveform of the inductor voltage to serve as an inductor current detection signal, to perform loop protection on the PFC circuit or perform over-current protection on the PFC circuit by using the inductor current detection signal.

Preferably, the step of detecting a voltage on a boost inductor of a critical-conduction mode PFC circuit, and obtaining an inductor voltage detection signal includes:

connecting in series a sense resistor with the boost inductor of the PFC circuit, and obtaining a voltage drop in conformity with a current of the boost inductor of the PFC circuit through the sense resistor; and taking the obtained voltage drop as the inductor voltage detection signal.

Preferably, the step of detecting a voltage on a boost inductor of a critical-conduction mode PFC circuit, and obtaining an inductor voltage detection signal includes:

enwinding an inductor auxiliary winding on a magnetic core of the boost inductor of the PFC circuit, and obtaining an induced voltage in conformity with the current of the boost inductor of the PFC circuit on the inductor auxiliary winding; and taking the obtained induced voltage as the inductor voltage detection signal.

Preferably, obtaining an induced voltage in conformity with the current of the boost inductor of the PFC circuit on the inductor auxiliary winding includes:

through electromagnetic coupling, obtaining a positive voltage corresponding to a rising waveform of the current of the boost inductor of the PFC circuit and a negative voltage corresponding to a falling waveform of the current of the boost inductor of the PFC circuit on the inductor auxiliary winding.

Preferably, obtaining an induced voltage in conformity with the current of the boost inductor of the PFC circuit on the inductor auxiliary winding includes:

through electromagnetic coupling, obtaining a positive pulse corresponding to a sawtooth wave rising edge of the current of the boost inductor of the PFC circuit and a negative pulse corresponding to a sawtooth wave falling edge of the current of the boost inductor of the PFC circuit on the inductor auxiliary winding.

Preferably, the step of converting the inductor voltage detection signal into a voltage signal whose waveform is consistent with a current waveform of the inductor to serve as an inductor current detection signal includes:

performing integral processing on the inductor voltage detection signal, and taking an inductor voltage detection signal on which the integral processing is performed as the inductor current detection signal, herein a waveform of the inductor current detection signal is consistent with a waveform of a current signal of the boost inductor of the PFC circuit.

Preferably, the step of performing integral processing on the inductor voltage detection signal includes:

performing integral processing on the positive voltage and the negative voltage obtained on the inductor auxiliary winding, and switching on or switching off a corresponding switch tube to charge or discharge a capacitor in a connected integral circuit;

detecting a voltage across two ends of the capacitor in the integral circuit, and obtaining a voltage detection signal in conformity with the inductor current waveform after the integral processing.

Preferably, the step of performing integral processing on the inductor voltage detection signal includes:

by performing integral processing on the positive pulse and the negative pulse obtained on the inductor auxiliary winding, driving to switch on or switch off a corresponding switch tube to charge or discharge a capacitor in a connected integral circuit;

detecting a voltage across two ends of the capacitor in the integral circuit, and obtaining a voltage detection signal in conformity with the inductor current waveform after the integral processing.

According to another aspect of the embodiment of the present document, a device for detecting inductor current of a PFC circuit is provided, which includes:

a detection module, configured to detect a voltage on a boost inductor of a critical-conduction mode PFC circuit, and obtain an inductor voltage detection signal; and a conversion module, configured to convert the inductor voltage detection signal into a voltage signal whose waveform is consistent with a current waveform the inductor to serve as an inductor current detection signal, to perform loop protection on the PFC circuit or perform over-current protection on the PFC circuit by using the inductor current detection signal.

Preferably, the conversion module includes:

an integral submodule, configured to perform integral processing on the inductor voltage detection signal, and take an inductor voltage detection signal on which the integral processing is performed as the inductor current detection signal, herein a waveform of the inductor current detection signal is consistent with the waveform of a current signal of the boost inductor of the PFC circuit.

Compared with the related art, the beneficial effects of the embodiments of the present document lie in that: in the embodiments of the present document, through the method for detecting the inductor voltage of the critical-conduction mode PFC circuit and indirectly obtaining the inductor current, the function of detecting the inductor current of the critical-conduction mode PFC circuit can be realized.

PREFERRED EMBODIMENTS

The preferred embodiments of the present document will be described in detail in combination with the accompanying drawings below. It should be understood that the preferred embodiments described below are only used to describe and explain the present document, which is not used to limit the present document. The embodiments in the present document and the characteristics in the embodiments can be arbitrarily combined in the case of no conflict.

Figure 1:
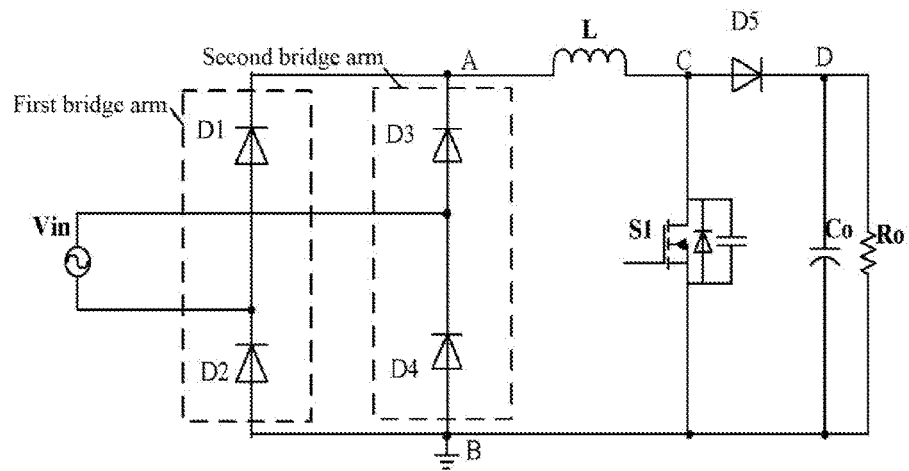
FIG. 1 is a structure diagram of a critical-conduction bridge PFC circuit for detecting inductor current of the PFC circuit in the related art.
Figure 2:
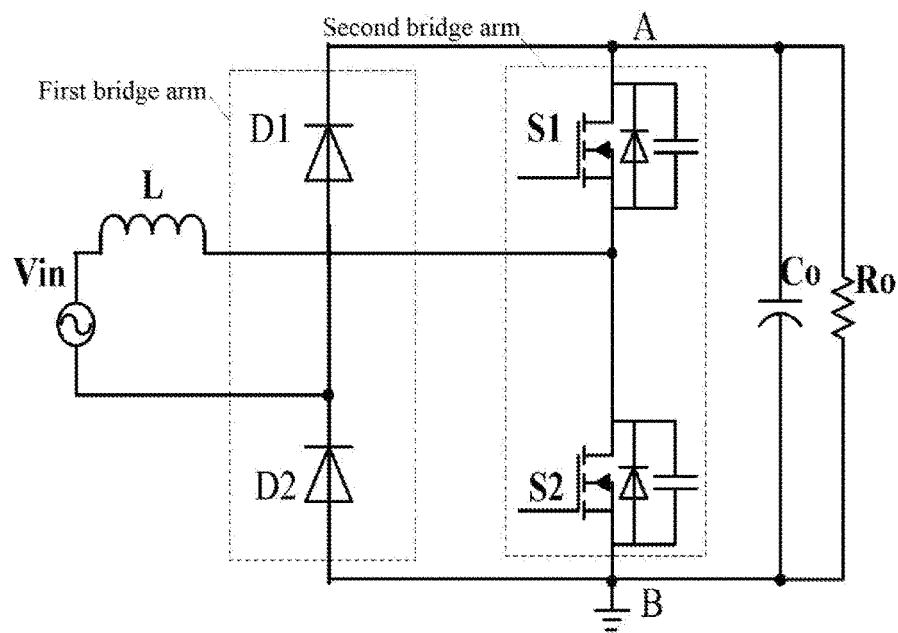
FIG. 2 is a structure diagram of a totem-pole-type bridgeless PFC circuit for detecting inductor current of the PFC circuit in the related art.
Figure 3:
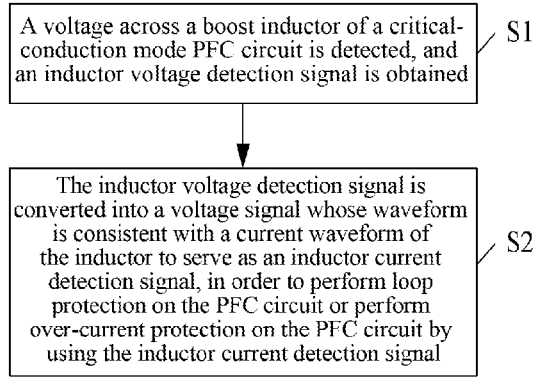
FIG. 3 is a principle diagram of a method for detecting inductor current of a PFC circuit provided in the embodiment of the present document.

FIG. 3 is a principle diagram of a method for detecting inductor current of a PFC circuit provided in the embodiment of the present document. As shown in FIG. 3, the specific steps are as follows:

In step S1, a device for detecting the inductor current of the PFC circuit detects a voltage on a boost inductor of a critical-conduction mode PFC circuit, and obtains an inductor voltage detection signal.

In the step S1, by connecting in series a sense resistor with the boost inductor of the PFC circuit, a voltage drop in conformity with current of the boost inductor of the PFC circuit is obtained through the sense resistor; and the obtained voltage drop is taken as the inductor voltage detection signal.

Alternatively, through electromagnetic coupling, a positive voltage corresponding to a rising waveform of the current of the boost inductor of the PFC circuit and a negative voltage corresponding to a falling waveform of the current of the boost inductor of the PFC circuit are obtained on an inductor auxiliary winding.

Or, the inductor auxiliary winding is enwound on a magnetic core of the boost inductor of the PFC circuit, and an induced voltage in conformity with the current of the boost inductor of the PFC circuit is obtained on the inductor auxiliary winding; and the obtained induced voltage is taken as the inductor voltage detection signal.

Alternatively, through electromagnetic coupling, a positive pulse corresponding to a sawtooth wave rising edge of the current of the boost inductor of the PFC circuit and a negative pulse corresponding to a sawtooth wave falling edge of the current of the boost inductor of the PFC circuit are obtained on the inductor auxiliary winding.

In step S2, the device for detecting the inductor current of the PFC circuit converts the inductor voltage detection signal into a voltage signal whose waveform is consistent with a current waveform of the inductor to serve as an inductor current detection signal, in order to perform loop protection on the PFC circuit or perform over-current protection on the PFC circuit by using the inductor current detection signal.

In the step S2, integral processing is performed on the inductor voltage detection signal, and an inductor voltage detection signal on which the integral processing is performed is taken as the inductor current detection signal, herein the waveform of the inductor current detection signal is consistent with a waveform of a current signal of the boost inductor of the PFC circuit.

Alternatively, the step of performing integral processing on the inductor voltage detection signal includes:

integral processing is performed on the positive voltage and the negative voltage obtained on the inductor auxiliary winding, and it is to switch on or switch off a corresponding switch tube to charge or discharge a capacitor in a connected integral circuit;

a voltage across two ends of the capacitor in the integral circuit is detected, and a voltage detection signal in conformity with the inductor current waveform after the integral processing is obtained.

Alternatively, the step of performing integral processing on the inductor voltage detection signal also includes:

by performing integral processing on the positive pulse and the negative pulse obtained on the inductor auxiliary winding, a corresponding switch tube is driven to be switched on or switched off to charge or discharge a capacitor in a connected integral circuit;

a voltage across two ends of the capacitor in the integral circuit is detected, and a voltage detection signal in conformity with the inductor current waveform after the integral processing is obtained.

Figure 4:
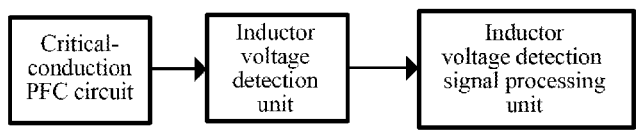
FIG. 4 is a schematic diagram of a structure of a device for detecting inductor current of a PFC circuit provided in the embodiment of the present document.

FIG. 4 is a schematic diagram of a structure of a device for detecting inductor current of a PFC circuit provided in the embodiment of the present document. As shown in FIG. 4, the device includes a critical-conduction PFC circuit, an inductor voltage detection unit and an inductor voltage detection signal processing unit.

The critical-conduction PFC circuit includes a related bridge power factor correction circuit and a related power factor correction circuit without a rectifier bridge for which a inductor current works in a critical continuous mode.

The inductor voltage detection unit is used to detect a voltage on the inductor of the PFC circuit and take the detected inductor voltage signal of the PFC circuit as the input of the inductor voltage detection signal processing unit. Herein, the inductor voltage detection unit may perform direct detection by using a divider resistor. For example, the inductor voltage of the PFC circuit is detected by using the divider resistor, the divider resistor is cascaded with the inductor of the PFC circuit, a voltage drop in conformity with the inductor current of the PFC circuit is detected, and then the detected voltage drop is sent to the inductor voltage detection signal processing unit. Moreover, the inductor auxiliary winding may also be used to perform detection. For example, the inductor auxiliary winding is preferably a winding coupled on a magnetic core of the inductor of the PFC circuit, voltages at two ends of the inductor of the PFC circuit are respectively detected, and then the detected voltage signals are respectively sent to the inductor voltage detection signal processing unit.

Herein, the inductor voltage detection unit implements a function of a detection module, that is, the detection module is used for detecting the voltage on the boost inductor of the critical-conduction mode PFC circuit, and obtains the inductor voltage detection signal.

The inductor voltage detection signal processing unit is used for performing an integral on the detected inductor voltage signal through a certain integral circuit to restore it back to the inductor current signal. Alternatively, the inductor voltage detection signal processing unit includes one integral circuit, herein, one end of the integral circuit is connected with the inductor voltage detection unit, and the other end is connected with the earth ground. The voltage on a capacitor in the integral circuit is a detection value of the inductor current, that is, the inductor voltage detection signal processing unit converts the input inductor voltage signal into the inductor current signal through processing, herein, the output of the inductor voltage detection signal processing unit is the inductor current signal required to be obtained. In addition, the inductor voltage detection signal processing unit includes some switch tubes used for enabling all inductor currents of positive and negative half cycles of the input voltage to be output from one output port, and the inductor currents are used for performing loop protection on the PFC circuit or performing over-current protection on the PFC circuit. The inductor voltage detection signal processing unit also includes some other switch tubes used for performing selection on inductor voltage signals of the positive and negative half cycles, thereby detecting correct inductor current output signals.

Herein, the inductor voltage detection signal processing unit implements a function of a conversion module, that is, the conversion module is used for converting the inductor voltage detection signal into a voltage signal whose waveform is consistent with a current waveform of the inductor to serve as an inductor current detection signal, in order to perform loop protection on the PFC circuit or perform over-current protection on the PFC circuit by using the inductor current detection signal. An integral submodule of the conversion module is used for performing integral processing on the inductor voltage detection signal, and an inductor voltage detection signal on which the integral processing is performed is taken as the inductor current detection signal, herein the waveform of the inductor current detection signal is consistent with a waveform of a current signal of the boost inductor of the PFC circuit.

The working principle of the inductor voltage detection signal processing unit includes: the inductor current of the critical-conduction mode PFC circuit rises from zero to a maximum value, and then falls from the maximum value to zero within one switch period. Therefore, the voltage on the inductor of the PFC circuit will have two times of overturn within one switch period, one is the overturn from the positive voltage to the negative voltage, and the other is the overturn from the negative voltage to the positive voltage. Since the inductor voltage of the PFC circuit will be overturned at the maximum value of the inductor current, a resistor and capacitor signal processing circuit in the inductor voltage detection signal processing unit will perform a charging integral at the stage of the inductor current rising and perform discharging at the stage of the inductor current falling, and the voltage signal on the capacitor is the inductor current signal whose waveform is consistent with the inductor current waveform of the PFC circuit.

Alternatively, the inductor voltage detection unit sends the detected inductor voltage of the PFC circuit to the inductor voltage detection signal processing unit to be processed, the inductor voltage detection signal processing unit makes the received inductor voltage signal of the PFC circuit pass through the signal processing circuit composed of the resistor and capacitor and the switch tubes, and the inductor voltage signal of the PFC circuit is processed into the inductor current signal of the PFC circuit.

Figure 5:
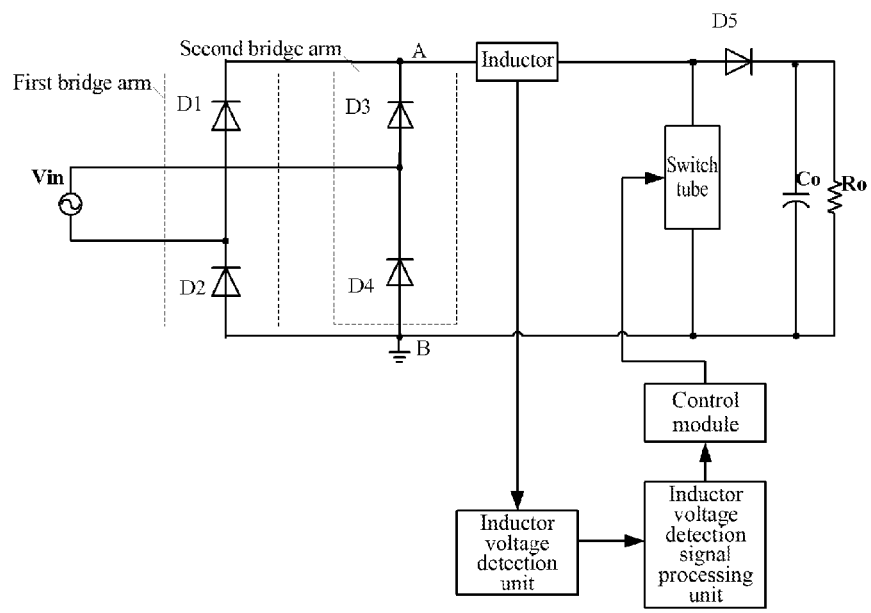
FIG. 5 is a schematic diagram of a device for detecting inductor current of the critical-conduction bridge PFC circuit for detecting the inductor current of the PFC circuit provided in the embodiment of the present document.
Figure 6:
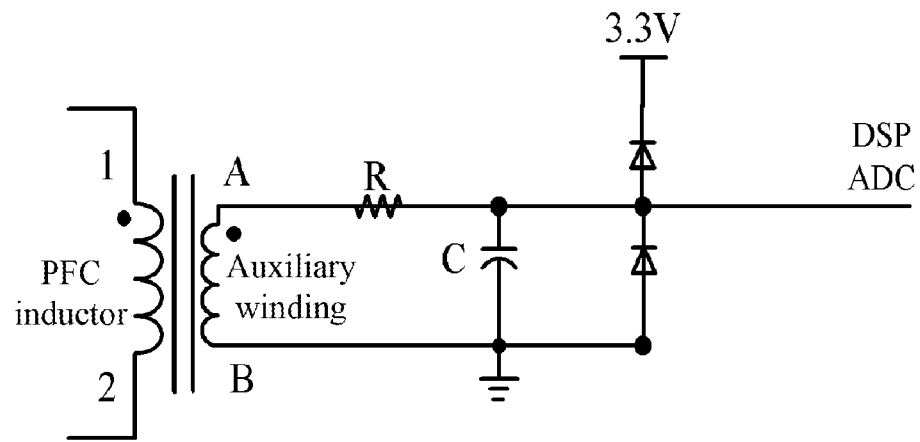
FIG. 6 is a circuit principle diagram of detecting the inductor current of the critical-conduction bridge PFC circuit for detecting the inductor current of the PFC circuit provided in the embodiment of the present document.

FIG. 5 is a schematic diagram of a device for detecting inductor current of the critical-conduction bridge PFC circuit for detecting the inductor current of the PFC circuit provided in the embodiment of the present document, and FIG. 6 is a circuit principle diagram of detecting the inductor current of the critical-conduction bridge PFC circuit for detecting the inductor current of the PFC circuit provided in the embodiment of the present document. As shown in FIG. 5 and FIG. 6, one auxiliary winding is added and enwound on a PFC inductor of the related device for detecting the inductor current of the critical-conduction bridge PFC, and the auxiliary winding of the PFC inductor is coupled on a magnetic core of the PFC inductor. Herein, an end A of the inductor auxiliary winding of the PFC circuit and an end 1 of the inductor of the PFC circuit are dotted terminals, an end B of the inductor auxiliary winding of the PFC circuit is earthed. The end A of the inductor auxiliary winding of the PFC circuit is connected with a resistor R, the other end of the resistor R is connected with a capacitor C, and the other end of the capacitor C is earthed. When the inductor current of the PFC circuit rises, the end A and end B of the auxiliary winding are positive voltages; and when the inductor current falls, the end A and end B of the auxiliary winding are negative voltages. Therefore, the voltage waveform on the capacitor C is obtained in the way that the inductor auxiliary winding of the PFC circuit uses the RC integral according to the inductor voltage of the PFC circuit obtained through sampling. The voltage waveform on the capacitor C represents a waveform of the inductor current of the PFC circuit. Then, the voltage waveform on the capacitor C enters an Analog-to-Digital Converter (ADC) sampling port of a Digital Signal Processor (DSP).

Figure 7:
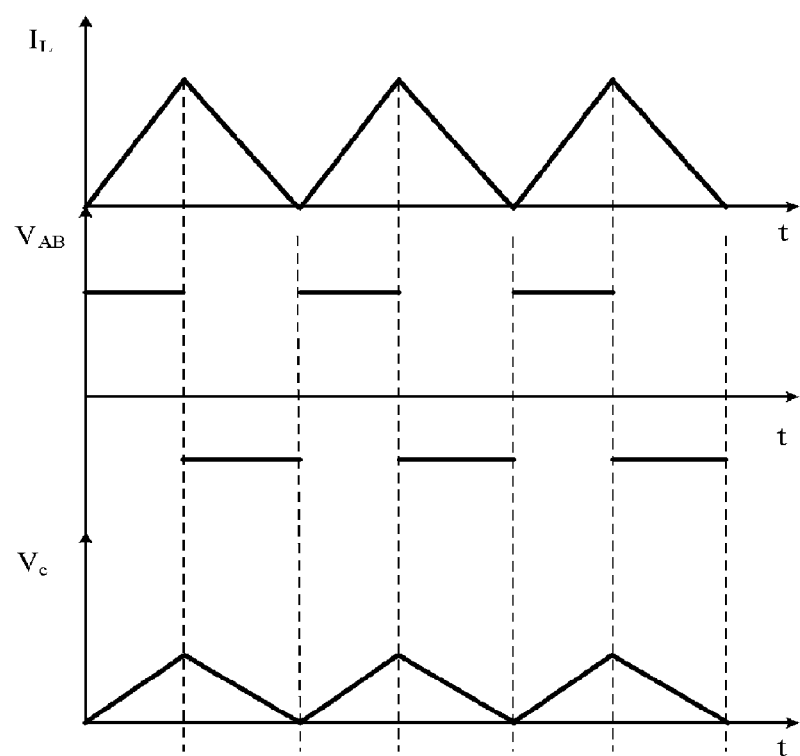
FIG. 7 is an oscillogram corresponding to various parts of a circuit for detecting the inductor current of the critical-conduction bridge PFC circuit for detecting the inductor current of the PFC circuit provided in the embodiment of the present document.

FIG. 7 is an oscillogram corresponding to various parts of a circuit for detecting the inductor current of the critical-conduction bridge PFC circuit for detecting the inductor current of the PFC circuit provided in the embodiment of the present document. As shown in FIG. 7, a first waveform IL is a waveform of the inductor current of the critical-conduction bridge PFC circuit, a second waveform VAB is an inductor voltage waveform of the PFC circuit detected on the inductor auxiliary winding of the PFC circuit, and a third waveform VC is a corresponding waveform on the capacitor C in the RC integral circuit, and the third waveform VC is similar to the waveform of the inductor current of the PFC circuit, that is, the voltage waveform on the capacitor C is the waveform entering the ADC sampling port of the DSP.

Figure 8:
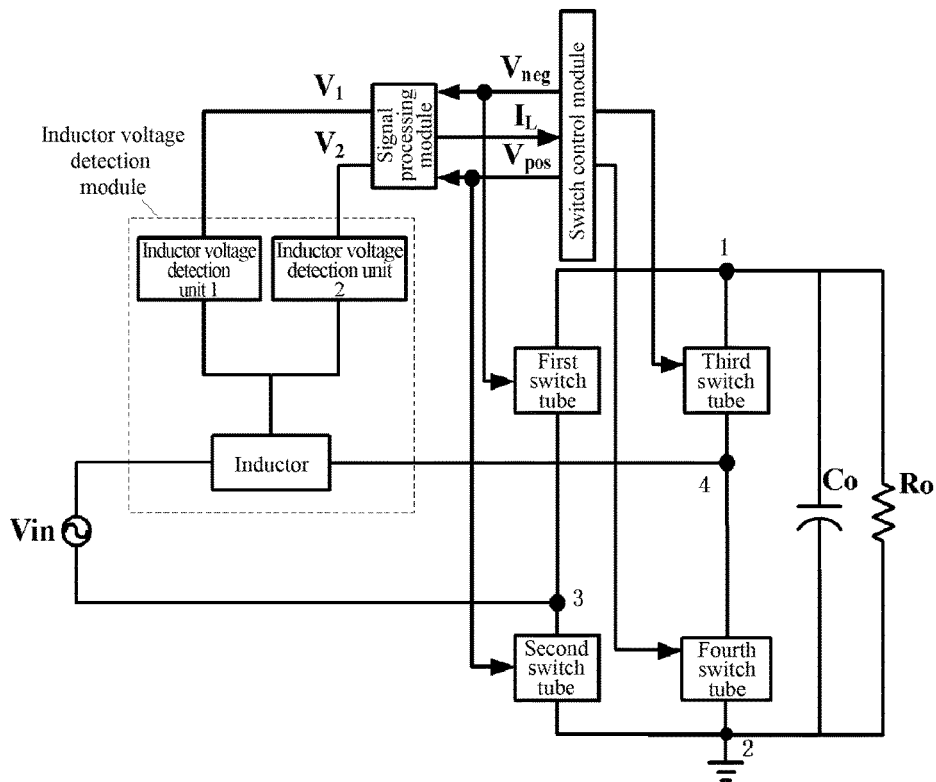
FIG. 8 is a schematic diagram of a structure of a device for detecting inductor current of the totem-pole-type bridgeless PFC circuit for detecting the inductor current of the PFC circuit provided in the embodiment of the present document.
Figure 9:
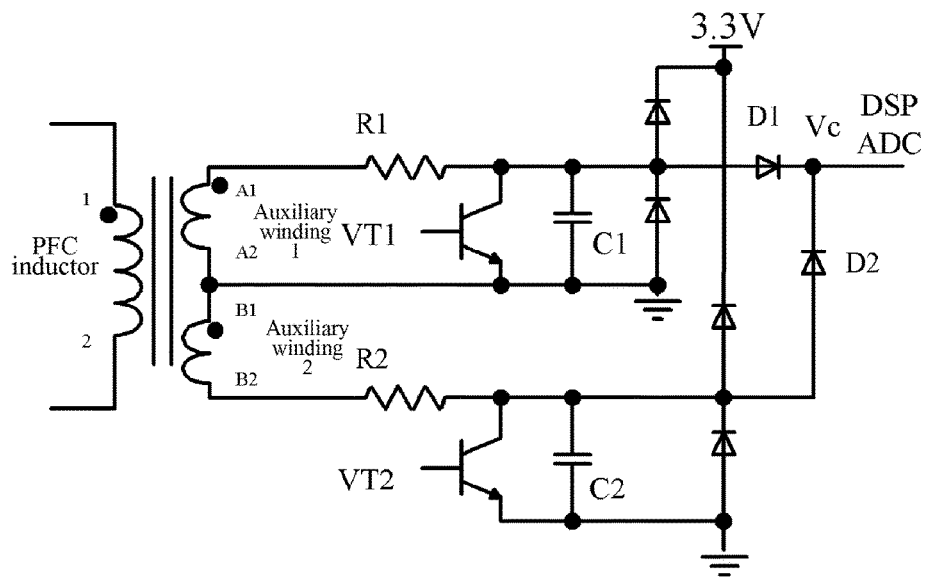
FIG. 9 is a first circuit principle diagram of detecting the inductor current of the totem-pole-type bridgeless PFC circuit for detecting the inductor current of the PFC circuit provided in the embodiment of the present document.

FIG. 8 is a schematic diagram of a structure of a device for detecting inductor current of the totem-pole-type bridgeless PFC circuit for detecting the inductor current of the PFC circuit provided in the embodiment of the present document, and FIG. 9 is a first circuit principle diagram of detecting the inductor current of the totem-pole-type bridgeless PFC circuit for detecting the inductor current of the PFC circuit provided in the embodiment of the present document. The device for detecting the inductor current of the totem-pole-type bridgeless PFC circuit according to the present document will be concretely described through one specific application example in the embodiments of the present document, certainly the device for detecting the inductor current is not limited to such form of the embodiments of the present document, people skilled in the art may also choose and adopt other similar forms according to the professional knowledge mastered by them, as long as various functions can be implemented. As shown in FIG. 8 and FIG. 9, two auxiliary windings are added and enwound on the inductor of the PFC circuit of the totem-pole-type bridgeless PFC circuit, and are respectively used for detecting corresponding inductor voltages when the input alternating voltage is in positive and negative half cycles, and both the two inductor auxiliary windings of the PFC circuit are coupled on a magnetic core of the inductor of the PFC circuit. Herein, an end A1 of the inductor auxiliary winding 1 of the PFC circuit, an end B1 of the inductor auxiliary winding 2 of the PFC circuit and an end 1 of the inductor of the PFC circuit are dotted terminals, an end A2 of the inductor auxiliary winding 1 of the PFC circuit connecting with the end B1 of the inductor auxiliary winding 2 of the PFC circuit is earthed. The end A1 of the inductor auxiliary winding 1 of the PFC circuit is connected with a resistor R1, an end B2 of the inductor auxiliary winding 2 of the PFC circuit is connected with a resistor R2, the other end of the resistor R1 is connected with a collector of a switch triode VT1 and the other end of the resistor R2 is connected with a collector of a switch triode VT2, emitters of the switch triodes VT1 and VT2 are earthed, a capacitor C1 is connected in parallel with the collector and emitter of the switch triode VT1 and a capacitor C2 is connected in parallel with the collector and emitter of the switch triode VT2, the collector of the switch triode VT1 is connected with an anode of a diode D1 and the collector of the switch triode VT2 is connected with an anode of a diode D2, cathodes of the D1 and D2 are joined together and connected with the ADC sampling port of the DSP. During the power frequency positive half cycle, the inductor current of the PFC circuit flows from the end 1 to the end 2, when the inductor current rises, the end A1 of the inductor auxiliary winding 1 of the PFC circuit is a positive voltage, and the end A2 is a negative voltage, but the end B1 of the inductor auxiliary winding 2 of the PFC circuit is a negative voltage, and the end B2 is a positive voltage; when the inductor current falls, the end A1 of the inductor auxiliary winding 1 of the PFC circuit is a negative voltage, and the end A2 is a positive voltage, but the end B1 of the inductor auxiliary winding 2 of the PFC circuit is a positive voltage, and the end B2 is a negative voltage. Therefore, during the power frequency positive half cycle, the switch triode VT2 is driven, so that the switch triode VT2 is always in an on-state, and the switch triode VT1 has no drive voltage, thus the switch triode VT1 is always in an off-state. Thus, the voltage waveform on the capacitor C1 is obtained in a way that the inductor auxiliary winding 1 of the PFC circuit uses the RC integral according to the inductor voltage of the PFC circuit obtained through sampling, and the voltage waveform on the capacitor C1 represents a waveform of the inductor current of the PFC circuit, and then enters an ADC sampling port of the DSP, but since the switch triode VT2 is always in an on-state, the voltage of the capacitor C2 is zero, thus the inductor current of the PFC circuit in the power frequency positive half cycle may be obtained. During the power frequency negative half cycle, the inductor current of the PFC circuit flows from the end 2 to the end 1, when the inductor current rises, the end A1 of the inductor auxiliary winding 1 of the PFC circuit is a negative voltage, and the end A2 is a positive voltage, but the end B1 of the inductor auxiliary winding 2 of the PFC circuit is a positive voltage, and the end B2 is a negative voltage; when the inductor current falls, the end A1 of the inductor auxiliary winding 1 of the PFC circuit is a positive voltage, and the end A2 is a negative voltage, but the end B1 of the inductor auxiliary winding 2 of the PFC circuit is a negative voltage, and the end B2 is a positive voltage. Therefore, during the power frequency negative half cycle, the switch triode VT1 is driven, so that the switch triode VT1 is always in an on-state, and the switch triode VT2 has no drive voltage, thus the switch triode VT2 is always in an off-state. Thus, the voltage waveform on the capacitor C2 is obtained in a way that the inductor auxiliary winding 2 of the PFC circuit uses the RC integral according to the inductor voltage of the PFC circuit obtained through sampling, and the voltage waveform on the capacitor C2 represents a waveform of the inductor current of the PFC circuit, and then enters an ADC sampling port of the DSP, but since the switch triode VT1 is always in an on-state, the voltage of the capacitor C1 is zero, thus the inductor current of the PFC circuit in the power frequency negative half cycle may be obtained.

Figure 10:
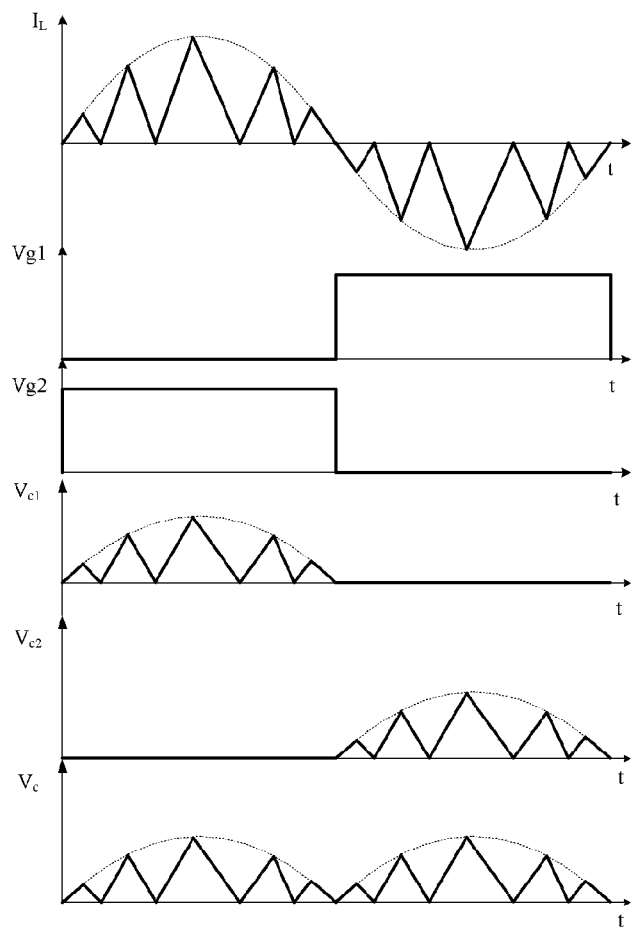
FIG. 10 is a first oscillogram corresponding to various parts of a circuit for detecting the inductor current of the totem-pole-type bridgeless PFC circuit for detecting the inductor current of the PFC circuit provided in the embodiment of the present document.

FIG. 10 is a first oscillogram corresponding to various parts of a circuit for detecting the inductor current of the totem-pole-type bridgeless PFC circuit for detecting the inductor current of the PFC circuit provided in the embodiment of the present document. As shown in FIG. 10, a first waveform IL is a waveform of the inductor current of the totem-pole-type bridgeless PFC circuit, a second waveform Vg1 is a drive voltage waveform of the switch triode VT1, a third waveform Vg2 is a drive voltage waveform of the switch triode VT2, a fourth waveform VC1 is a voltage waveform of the capacitor C1, a fifth waveform VC2 is a voltage waveform of the capacitor C2, and a sixth waveform VC is the final output inductor current waveform of the PFC circuit.

Figure 11:
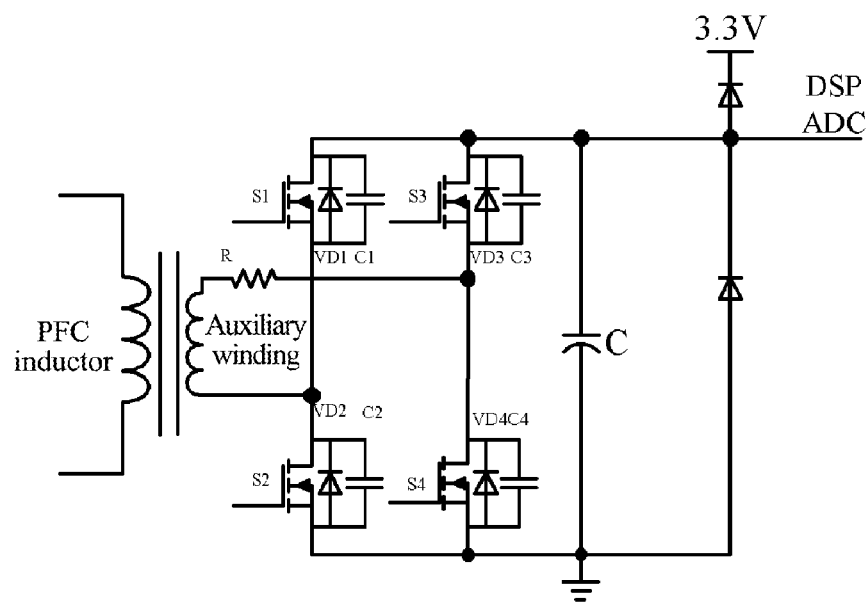
FIG. 11 is a second circuit principle diagram of detecting the inductor current of the totem-pole-type bridgeless PFC circuit for detecting the inductor current of the PFC circuit provided in the embodiment of the present document.

FIG. 11 is a second circuit principle diagram of detecting the inductor current of the totem-pole-type bridgeless PFC circuit for detecting the inductor current of the PFC circuit provided in the embodiment of the present document. As shown in FIG. 8 and FIG. 11, a single inductor auxiliary winding of the PFC circuit, four switch tubes, one resistor and one capacitor are used to complete the inductor current sampling of the PFC circuit. During the positive half cycle of the input alternating voltage, switch tubes S2 and S3 are always switched on, switch tubes S1 and S4 are always switched off, thus when the inductor current of the PFC circuit rises, the inductor auxiliary winding of the PFC circuit charges the capacitor C through the resistor R, and when the inductor current of the PFC circuit falls, the capacitor C discharges for the inductor auxiliary winding of the PFC circuit through the resistor R, thus the voltage waveform obtained on the capacitor C is the inductor current waveform of the PFC circuit in the positive half cycle; during the negative half cycle of the input alternating voltage, the switch tubes S1 and S4 are switched on, the switch tubes S2 and S3 are switched off, when the inductor current of the PFC circuit rises, the inductor auxiliary winding of the PFC circuit charges the capacitor C through the resistor R, and when the inductor current of the PFC circuit falls, the capacitor C discharges for the inductor auxiliary winding of the PFC circuit through the resistor R, thus the voltage waveform obtained on the capacitor C is the inductor current waveform of the PFC circuit in the negative half cycle.

Figure 12:
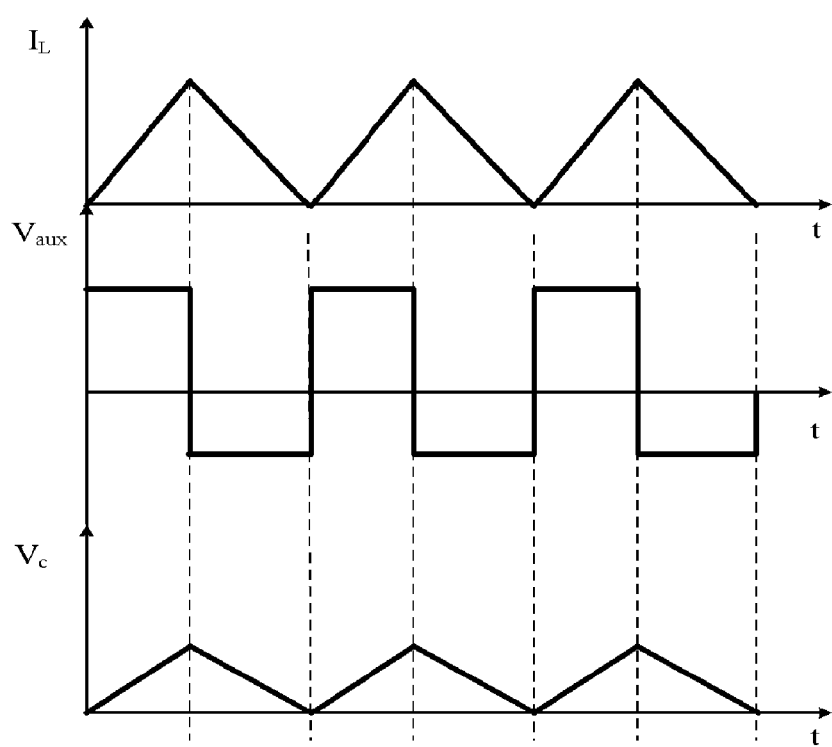
FIG. 12 is a second oscillogram corresponding to various parts of a circuit for detecting the inductor current of the totem-pole-type bridgeless PFC circuit for detecting the inductor current of the PFC circuit provided in the embodiment of the present document.

FIG. 12 is a second oscillogram corresponding to various parts of a circuit for detecting the inductor current of the totem-pole-type bridgeless PFC circuit for detecting the inductor current of the PFC circuit provided in the embodiment of the present document. As shown in FIG. 12, a first waveform IL is a waveform of the inductor current of the totem-pole-type bridgeless PFC circuit, a second waveform Vaux is an inductor voltage waveform detected on the inductor auxiliary winding of the PFC circuit, and a third waveform VC is a corresponding waveform on the capacitor C in the RC integral circuit, and a shape of the third waveform VC is similar to a waveform of the inductor current of the PFC circuit, that is, the voltage waveform on the capacitor C is the waveform entering the ADC sampling port of the DSP.

In conclusion, the embodiments of the present document have the following technical effects: in the embodiments of the present document, through the method for detecting the inductor voltage of the critical-conduction mode PFC circuit and indirectly obtaining the inductor current, the function of detecting the inductor current of the critical-conduction mode PFC circuit can be realized, and loop control on the system or protection control on the inductor current peak value can be achieved by using the detected inductor current.

Though the embodiments of the present document have been described in detail above, the present document is not limited to this, and people skilled in the art can make various modifications according to the principle of the present document. Therefore, it should be understood that all the modifications made according to the principle of the resent document fall into the protection scope of the present document.

INDUSTRIAL APPLICABILITY

In the above technical scheme, through the method for detecting the inductor voltage of the critical-conduction mode PFC circuit and indirectly obtaining the inductor current, the function of detecting the inductor current of the critical-conduction mode PFC circuit may be realized.

What is claimed is:
1. A method for detecting inductor current of a power factor correction (PFC) circuit, comprising:
   detecting a voltage on a boost inductor of a critical-conduction mode PFC circuit, and obtaining an inductor voltage detection signal;
   converting the inductor voltage detection signal into a voltage signal of which a waveform is consistent with a current waveform of the inductor to serve as an inductor current detection signal, to perform loop pro- tection on the PFC circuit or perform over-current protection on the PFC circuit by using the inductor current detection signal;

wherein, the step of detecting a voltage on a boost inductor of a critical-conduction mode PFC circuit, and obtaining an inductor voltage detection signal comprises:

enwinding two inductor auxiliary windings on a magnetic core of the boost inductor of the PFC circuit for respectively detecting corresponding inductor voltages when an input alternating voltage is in positive and negative half cycles, and obtaining induced voltages in conformity with the current of the boost inductor of the PFC circuit on the inductor auxiliary windings; and taking the obtained induced voltages as the inductor voltage detection signal;

wherein an end of a first inductor auxiliary winding of the PFC circuit is connected with a resistor R1, an end of a second inductor auxiliary winding of the PFC circuit is connected with a resistor R2, the other end of the resistor R1 is connected with a collector of a switch triode VT1 and the other end of the resistor R2 is connected with a collector of a switch triode VT2, emitters of the switch triodes VT1 and VT2 are earthed, a capacitor C1 is connected in parallel with the collector and emitter of the switch triode VT1 and a capacitor C2 is connected in parallel with the collector and emitter of the switch triode VT2, the collector of the switch triode VT1 is connected with an anode of a diode D1 and the collector of the switch triode VT2 is connected with an anode of a diode D2, cathodes of the D1 and D2 are joined together and connected with an Analog-to-Digital Converter (ADC) sampling port of a Digital Signal Processor (DSP).

2. The method according to claim 1, wherein, said obtaining induced voltages in conformity with the current of the boost inductor of the PFC circuit on the inductor auxiliary windings comprises:

through electromagnetic coupling, obtaining a positive voltage corresponding to a rising waveform of the current of the boost inductor of the PFC circuit and a negative voltage corresponding to a falling waveform of the current of the boost inductor of the PFC circuit on the two inductor auxiliary windings respectively.

3. The method according to claim 2, wherein, the step of converting the inductor voltage detection signal into a voltage signal of which a waveform is consistent with a current waveform of the inductor to serve as an inductor current detection signal comprises:

performing integral processing on the inductor voltage detection signal, and taking the inductor voltage detection signal on which the integral processing is performed as the inductor current detection signal, wherein a waveform of the inductor current detection signal is consistent with a waveform of a current signal of the boost inductor of the PFC circuit.

4. The method according to claim 3, wherein, the step of performing integral processing on the inductor voltage detection signal comprises:

performing integral processing on the positive voltage and the negative voltage obtained on the two inductor auxiliary windings respectively, and switching on or switching off a corresponding switch tube to charge or discharge a capacitor in a connected integral circuit;

detecting a voltage across two ends of the capacitor in the integral circuit, and obtaining the inductor current detection signal in conformity with the inductor current waveform after the integral processing.

5. The method according to claim 1, wherein, said obtaining induced voltages in conformity with the current of the boost inductor of the PFC circuit on the inductor auxiliary windings comprises:

through electromagnetic coupling, obtaining a positive pulse corresponding to a sawtooth wave rising edge of the current of the boost inductor of the PFC circuit and a negative pulse corresponding to a sawtooth wave falling edge of the current of the boost inductor of the PFC circuit on the two inductor auxiliary windings respectively.

6. The method according to claim 5, wherein, the step of converting the inductor voltage detection signal into a voltage signal whose waveform is consistent with a current waveform of the inductor to serve as an inductor current detection signal comprises:

performing integral processing on the inductor voltage detection signal, and taking the inductor voltage detection signal on which the integral processing is performed as the inductor current detection signal, wherein a waveform of the inductor current detection signal is consistent with a waveform of a current signal of the boost inductor of the PFC circuit.

7. The method according to claim 6, wherein, the step of performing integral processing on the inductor voltage detection signal comprises:

by performing integral processing on the positive pulse and the negative pulse obtained on the two inductor auxiliary windings respectively, driving to switch on or switch off a corresponding switch tube to charge or discharge a capacitor in a connected integral circuit;

detecting a voltage across two ends of the capacitor in the integral circuit, and obtaining the inductor current detection signal in conformity with the inductor current waveform after the integral processing.

8. A device for detecting inductor current of a power factor correction (PFC) circuit, comprising:

a detection circuitry, configured to detect a voltage on a boost inductor of a critical-conduction mode PFC circuit, and obtain an inductor voltage detection signal, wherein two inductor auxiliary windings are enwound on a magnetic core of the boost inductor of the PFC circuit for respectively detecting corresponding inductor voltages when an input alternating voltage is in positive and negative half cycles, and induced voltages in conformity with the current of the boost inductor of the PFC circuit on the inductor auxiliary windings are obtained and taken as the inductor voltage detection signal; and a conversion circuitry, configured to convert the inductor voltage detection signal into a voltage signal of which a waveform is consistent with a current waveform of the inductor to serve as an inductor current detection signal, to perform loop protection on the PFC circuit or perform over-current protection on the PFC circuit by using the inductor current detection signal;

wherein an end of a first inductor auxiliary winding of the PFC circuit is connected with a resistor R1, an end of a second inductor auxiliary winding of the PFC circuit is connected with a resistor R2, the other end of the resistor R1 is connected with a collector of a switch triode VT1 and the other end of the resistor R2 is connected with a collector of a switch triode VT2, emitters of the switch triodes VT1 and VT2 are earthed, a capacitor C1 is connected in parallel with the collector and emitter of the switch triode VT1 and a capacitor C2 is connected in parallel with the collector and emitter of the switch triode VT2, the collector of the switch triode VT1 is connected with an anode of a diode D1 and the collector of the switch triode VT2 is connected with an anode of a diode D2, cathodes of the D1 and D2 are joined together and connected with an Analog-to-Digital Converter (ADC) sampling port of a Digital Signal Processor (DSP).

9. The device according to claim 8, wherein, the conversion circuitry comprises:
an integral circuitry, configured to perform integral processing on the inductor voltage detection signal, and take the inductor voltage detection signal on which the integral processing is performed as the inductor current detection signal, wherein a waveform of the inductor current detection signal is consistent with a waveform of a current signal of the boost inductor of the PFC circuit.

* * * * *